United States Patent
Kwon et al.

(10) Patent No.: US 12,488,993 B2
(45) Date of Patent: Dec. 2, 2025

(54) SUBSTRATE PROCESSING METHOD

(71) Applicant: TES Co., Ltd, Yongin-si (KR)

(72) Inventors: Bong-Soo Kwon, Yongin-si (KR); Do-Hyun Kim, Yongin-si (KR); Yu-Ri Park, Yongin-si (KR); Se-Chan Kim, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 214 days.

(21) Appl. No.: 18/241,606

(22) Filed: Sep. 1, 2023

(65) Prior Publication Data
US 2024/0079248 A1      Mar. 7, 2024

(30) Foreign Application Priority Data
Sep. 2, 2022   (KR) .................. 10-2022-0111573

(51) Int. Cl.
  *H01L 21/311*   (2006.01)

(52) U.S. Cl.
  CPC ... *H01L 21/31116* (2013.01); *H01L 21/31111* (2013.01)

(58) Field of Classification Search
  None
  See application file for complete search history.

(56) References Cited

U.S. PATENT DOCUMENTS

| | | | |
|---|---|---|---|
| 5,282,925 A * | 2/1994 | Jeng | H01L 21/31116 |
| | | | 257/E21.252 |
| 9,034,773 B2 * | 5/2015 | Thedjoisworo | H01L 21/02068 |
| | | | 438/723 |
| 2004/0110354 A1 * | 6/2004 | Natzle | H10D 84/038 |
| | | | 257/E21.252 |
| 2014/0273489 A1 * | 9/2014 | Wang | H01L 21/67739 |
| | | | 438/716 |
| 2018/0190793 A1 * | 7/2018 | Profijt | H10D 30/63 |
| 2021/0375634 A1 * | 12/2021 | Suzuki | C09K 13/06 |
| 2022/0359220 A1 * | 11/2022 | Lim | H01L 21/31111 |

FOREIGN PATENT DOCUMENTS

| | | |
|---|---|---|
| JP | 2009-094307 A | 4/2009 |
| JP | 2019-016698 A | 1/2019 |
| JP | 2020-088003 A | 6/2020 |
| KR | 10-2019-0096785 A | 8/2019 |
| KR | 10-2325905 B1 | 11/2021 |
| WO | WO 2015/060069 A1 | 4/2015 |

OTHER PUBLICATIONS

Japanese Office Action for related JP Application No. 2023-142764 mailed Jul. 23, 2024 from Japan Patent Office.

* cited by examiner

*Primary Examiner* — Shamim Ahmed
(74) *Attorney, Agent, or Firm* — Paratus Law Group, PLLC

(57) ABSTRACT

A substrate processing method, involving etching a silicon nitride layer selectively in a substrate where a silicon oxide layer and the silicon nitride layer are stacked, includes: wet-etching the silicon nitride layer with a phosphoric acid-based etching solution; and dry-etching a regrowth oxide, which is formed on a surface of the silicon oxide layer in the wet etching step, with an etching gas.

14 Claims, 8 Drawing Sheets

SUBSTRATE PROCESSING METHOD

CROSS-REFERENCE TO RELATED APPLICATION

This application claims priority to Korean Patent Application No. 10-2022-0111573 (filed on Sep. 2, 2022), which is hereby incorporated by reference in its entirety.

BACKGROUND

The present disclosure relates to a substrate processing method. In particular, the present disclosure relates to a substrate processing method in which a regrowth oxide created at the corner of a silicon oxide layer during wet etching of a silicon nitride layer with a phosphoric acid-based etching solution can be removed effectively.

At a time when semiconductor elements are micronized in recent years, the elements become highly integrated. Since silicon nitride layers are used as a dielectric layer or an insulation layer that is chemically stable, the layers are widely used in DRAM and FLASH Memory manufacturing processes, and used as a material for a side wall in the contact process or the capping process as well as a basic isolation process of a memory device, and the like.

Additionally, at a time of manufacturing of a semiconductor element, a silicon oxide layer and a silicon nitride layer are alternately stacked on a substrate in multiple layers. At this time, to etch the silicon nitride layers selectively, an etching solution of an etching selectivity higher than that of the silicon oxide layer needs to be applied.

Conventionally, the phosphoric acid-based etching solution is known as an etching solution of an etching selectivity higher than that of the silicon oxide layer. The phosphoric acid-based etching solution is used to wet-etch the silicon nitride layer.

The wet etching of the silicon nitride layer with the phosphoric acid-based etching solution entails a reaction based on reaction formula 1 hereafter, and is performed at a high temperature.

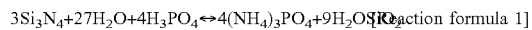

$$3Si_3N_4 + 27H_2O + 4H_3PO_4 \leftrightarrow 4(NH_4)_3PO_4 + 9H_2SiO_3 \quad \text{[Reaction formula 1]}$$

At this time, the creation of a regrowth oxide at the corner of the silicon oxide layer can be a problem while the silicon nitride layer is wet-etched with a phosphoric acid-based etching solution.

FIG. 1 is a schematic view showing the creation and an increase in the thickness of a regrowth oxide, based on the time passage of wet etching.

The regrowth oxide affects a following process and degrades the electrical properties of a finally produced semiconductor element.

Ordinarily, since a silicon-based compound is included as an additive in the phosphoric acid-based etching solution, a regrowth oxide is created. To prevent this from happening, in an existing method, the additive included in the phosphoric acid-based etching solution is adjusted to suppress the creation itself of the regrowth oxide during the wet etching of the silicon nitride layer (e.g., KR10-2325905B and KR10-2019-0096785A). However, in this method, the wet etching precess of the silicon nitride layer requires a long period of time.

SUMMARY

The present disclosure is directed to a substrate processing method in which a regrowth oxide can be created at a time of wet etching of a silicon nitride layer and can be removed based on dry etching in a following process, since a method in which the creation itself of the regrowth oxide is suppressed during the wet etching of the silicon nitride layer requires a long period of time.

The present disclosure is directed to a substrate processing method in which an etching selectivity of a regrowth oxide to an oxide that is formed based on deposition and the like can increase.

A substrate processing method of an embodiment, involving etching a silicon nitride layer selectively in a substrate where a silicon oxide layer and the silicon nitride layer are stacked, comprises: (a) wet-etching the silicon nitride layer with a phosphoric acid-based etching solution, wherein a regrowth oxide is formed on a surface of the silicon oxide layer; and (b) dry-etching the regrowth oxide in the step (a), with an etching gas.

In the step (b), the etching gas may comprise hydrogen fluoride only or hydrogen fluoride and ammonia. A flow rate of hydrogen fluoride may be about 20-60 sccm, and a flow rate of ammonia may be about 40 sccm or less.

The step (b) may be performed at the substrate's temperature of about 80-120° C.

The step (b) may be performed at processing pressure of about 0.3-1.0 Torr.

A substrate processing method of an embodiment, involving selectively etching a regrowth oxide that is on a surface of a silicon oxide layer and has density less than that of the silicon oxide layer, comprises: dry-etching the regrowth oxide with an etching gas.

The etching gas may comprise hydrogen fluoride and ammonia. At this time, a flow rate of hydrogen fluoride is about 20-60 sccm, and a flow rate of ammonia is about 40 sccm or less. The substrate processing method may further comprise raising a temperature of a substrate, to remove a reaction byproduct, after the dry etching.

The etching gas may consist of hydrogen fluoride. At this time, a flow rate of hydrogen fluoride may be about 20-60 sccm. The substrate processing method may further comprise raising a temperature of a substrate, to reduce fluorine content on a surface of the substrate, after the dry etching.

The dry etching may be performed at a substrate's temperature of about 80-120° C.

The dry etching may be performed at processing pressure of about 0.3-1.0 Torr.

In the substrate processing method of the present disclosure, the regrowth oxide created at a time of wet-etching the silicon nitride layer may be removed effectively based on dry etching.

In the substrate processing method, an etching selectivity of a regrowth oxide to an oxide that is formed based on deposition and the like under the control of the sort and flow rate of an etching gas, the temperature of the substrate and the processing pressure may improve.

The effects of the present disclosure are not limited to the above ones, and other effects that are not mentioned above can be clearly understood by one having ordinary skill in the art from the detailed description provided hereafter.

BRIEF DESCRIPTION OF DRAWINGS

The accompanying drawings constitute a part of the specification, illustrate one or more embodiments in the disclosure, and together with the specification, explain the disclosure.

DETAILED DESCRIPTION

Figure 1:
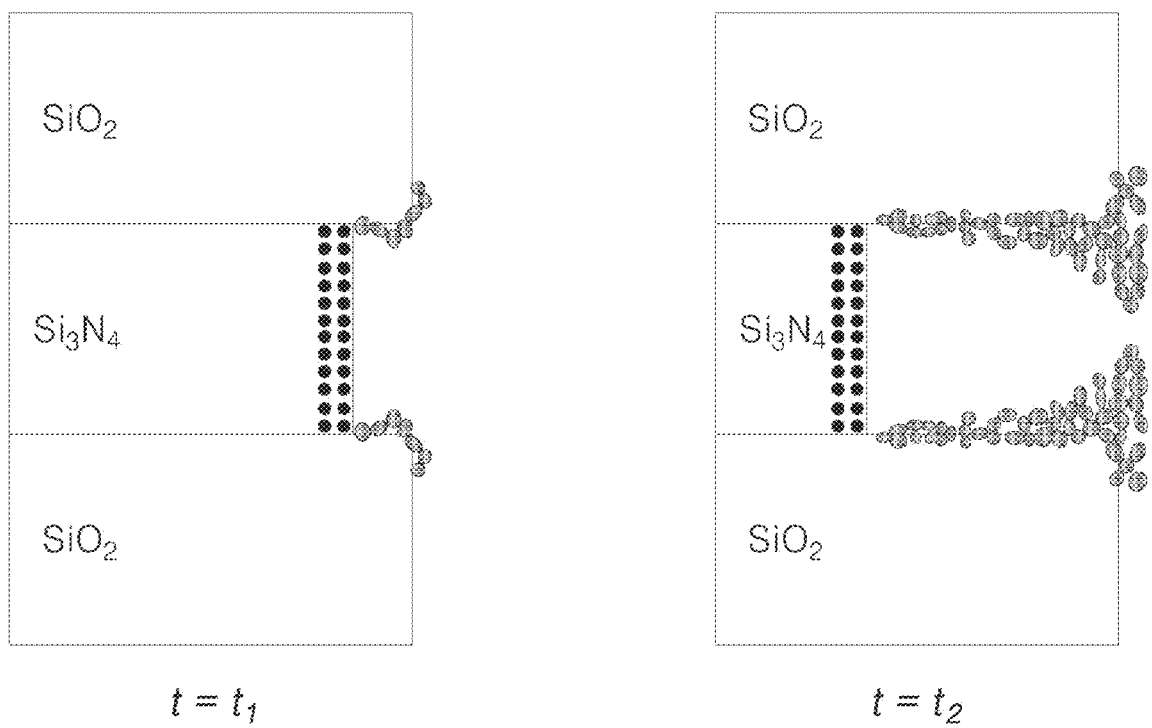
FIG. 1 is a schematic view showing the creation and an increase in the thickness of a regrowth oxide, based on the time passage of wet etching.

Advantages and features in the present disclosure and a method of ensuring the same can be clearly understood from embodiments that are described hereafter with reference to accompanying drawings. Embodiments of the disclosure, however, can be embodied in various different forms, and should not be construed as being limited to the embodiments set forth herein. Rather, the embodiments set forth herein are provided as examples so that the disclosure can be thorough and complete and can fully convey the scope of the disclosure to one having ordinary skill in the art. The subject matter of the disclosure is to be defined only according to the scope of claims.

When any one component or layer is described as being "on (or under)" another component or layer, any one component or layer can be directly on (or under) another component or layer, or an additional component or layer can be interposed between the two components or layers. When any one component is described as being "connected", "coupled" or "connected" to another component, any one component can be directly connected or coupled to another component, but an additional component can be "interposed" between the two components or the two components can be "connected", "coupled" or "connected" by an additional component.

Terms herein are used to describe the embodiments and are not intended to limit the subject matter of the disclosure. In the disclosure, singular forms include plural forms as well, unless explicitly indicated otherwise. In the disclosure, the terms "comprise" and/or "comprising" do not imply excluding the presence or addition of one or more other components, elements, steps and/or operations, in addition to stated components, elements, steps and/or operations.

Hereafter, a substrate processing method in preferred embodiments of the present disclosure is described with reference to the accompanying drawings.

The substrate processing method in the embodiments relates to a method in which a silicon nitride layer is selectively etched, in a substrate where a silicon oxide layer and the silicon nitride layer are stacked. The silicon oxide layer and the silicon nitride layer are alternately stacked to form a stack.

Specifically, the substrate processing method in the embodiments comprises wet-etching a silicon nitride layer and dry-etching a regrowth oxide.

The step of wet-etching a silicon nitride layer involves wet-etching a silicon nitride layer with a phosphoric acid-based etching solution. The phosphoric acid-based etching solution may comprise well-known etching solutions comprising a phosphoric acid. The phosphoric acid-based etching solution may comprise a silicon-based compound such as hexafluorosilicate, TEOS and the like, to increase an etching selectivity of the silicon nitride layer to the silicon oxide layer.

As described above, in the case where the phosphoric acid-based etching solution is used to wet-etch the silicon nitride layer, to etch the silicon nitride layer selectively in the substrate where the silicon oxide layer and the silicon nitride layer are stacked, a regrowth oxide may be created on the surface of the silicon oxide layer. The regrowth oxide is not dense and has density less than the density of the silicon oxide layer that is formed based on deposition and the like, and is soft. Accordingly, the regrowth oxide distinguishes from the silicon oxide layer that is formed based on deposition or thermal oxidation and the like. The regrowth oxide may be a silicon oxide. Since the regrowth oxide degrades the electrical properties of an element, the regrowth oxide needs to be removed.

Conventionally, the additives and the like of the phosphoric acid-based etching solution are controlled, to suppress the creation itself of the regrowth oxide in the wet etching process. However, this process requires a long period of time. In the present disclosure, a regrowth oxide generated in the wet etching step is removed based on dry etching, while the creation of a regrowth oxide is not suppressed in the wet etching process.

Specifically, in the dry etching step, the regrowth oxide created on the surface of the silicon oxide layer in the wet etching step is dry-etched with an etching gas. Specifically, the regrowth oxide being formed on the surface of the silicon oxide layer and having density less than the density of the silicon oxide layer is selectively dry-etched. The dry etching step may be performed in one cycle, and when necessary, in a plurality of cycles (n cycles). In the case where the dry etching step is performed in a plurality of cycles, damage to an underlying layer may additionally improve, for example.

At this time, it is important to increase an etching selectivity of the regrowth oxide to the silicon oxide layer that is formed in advance based on deposition, thermal oxidation and the like. The etching selectivity of the regrowth oxide to the silicon oxide layer may be about 5:1 or greater, and preferably, about 10:1 or greater, and more preferably, about 15:1 or greater. The etching selectivity of the regrowth oxide to the silicon oxide layer, as described hereafter, may be controlled based on the adjustment of the temperature of the substrate, the pressure of processing, the sort of an etching gas, a flow rate and the like.

In an example, the etching gas may comprise hydrogen fluoride and ammonia. In another example, the etching gas may consist of hydrogen fluoride. Hydrogen fluoride and/or ammonia may be supplied into a reaction chamber, together with an inert gas such as an argon gas.

The flow rate of ammonia is preferably about 40 sccm or less, and more preferably, about sccm or less. In the case where the flow rate of ammonia is about 40 sccm or less, even if the etching gas does not comprise ammonia, a high etching selectivity of the regrowth oxide to the silicon oxide layer may be obtained. Additionally, the flow rate of hydrogen fluoride is not limited but is preferably about 20-60 sccm considering both the etching speed and the etching selectivity.

Further, since an etching gas being comprised only of hydrogen fluoride has a much higher etching selectivity than the etching gas comprising hydrogen fluoride and ammonia, it is preferable to use the etching gas being comprised only of hydrogen fluoride.

After the dry etching step with an etching gas comprising fluorine and ammonia, a step of raising the temperature of the substrate to about 150-300° C. may be added to remove a reaction byproduct. Herein, a means for heating the substrate may not be limited. The means for heating the substrate may comprise a variety of means such as a means of heating a lamp, a means of heating a susceptor, a means of supplying a high-temperature gas. Further, even after the dry etching step with an etching gas being comprised only of fluorine, the temperature rising step may be performed to reduce fluorine. After the etching step and/or the temperature rising step, a purging step of purging the inside of the reaction chamber and/or a pumping step of removing the gas inside the reaction chamber may be added. Depending on the sort of an etching gas, it may be determined whether to apply the temperature rising step, and the order of processing may be determined.

For example, one-cycle dry etching with an etching gas comprising hydrogen fluoride and ammonia may be comprised of etching, temperature rising, purging and pumping.

In another example, one-cycle dry etching with an etching gas comprised only of hydrogen fluoride may be comprised of etching, purging, pumping and temperature rising.

In another example, n-cycle dry etching with an etching gas comprising hydrogen fluoride and ammonia may be comprised of etching & temperature rising n-cycle, purging and pumping.

In another example, n-cycle dry etching with an etching gas comprised only of hydrogen fluoride may be comprised of etching & purging n-cycle, pumping and temperature rising.

It is preferable to perform dry etching for removing a regrowth oxide may be performed at about 80-120° C. of the substrate. In the case where the temperature of the substrate is less than about 80° C., an etching selectivity of a regrowth oxide to a silicon oxide layer, which is about 5:1 or greater, is hardly obtained. In the case where the temperature of the substrate is greater than about 120° C., a high etching selectivity of a regrowth oxide to a silicon oxide layer is hardly obtained, and the etching speed of the regrowth oxide as well as the silicon oxide layer decreases rapidly, causing an etching step.

Further, the dry etching step for removing the regrowth oxide may be performed at processing pressure of about 0.3-1.0 Torr, preferably. In the case where the processing pressure is greater than about 1.0 Torr, a high etching selectivity of a regrowth oxide to a silicon oxide layer is hardly obtained. In the case where the pressing pressure is less than about 0.3 Torr, a high etching selectivity of a regrowth oxide to a silicon oxide layer may hardly be obtained, and an etching stop may occur.

Hereafter, the configuration and operation of the subject matter of the present disclosure are described with reference to the preferred embodiments. However, the embodiments are provided as examples, and the subject matter of the disclosure is not limited by the embodiments, in any aspect.

Particulars that are not described herein can be technically inferred by one having ordinary skill in the art, and description of the particulars can be omitted.

Figure 2:
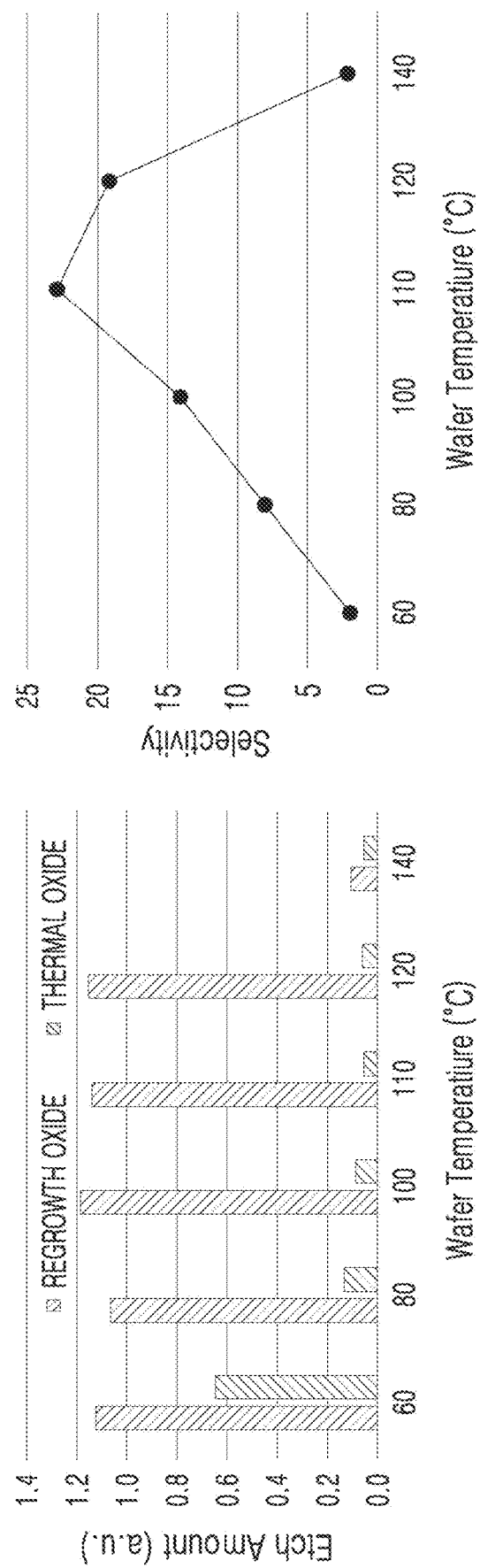
FIG. 2 is a graph showing the properties of dry etching of a regrowth oxide and a thermal oxide, based on the temperature of a wafer.

In FIG. 2 and the drawings described hereafter, the etching selectivity denotes an etch amount of the regrowth oxide in the case where an etch amount of the silicon oxide layer (unit: angstrom unit; a.u.) is 1, that is, denotes an etch amount of the regrowth oxide÷an etch amount of the silicon oxide layer.

Evaluation of Etching Properties of Regrowth Oxide Based on Temperature of Substrate Processing conditions are described as follows.
Processing temperature: 60° C., 80° C., 100° C., 110° C., 120° C. and 140° C.
Processing pressure: 1 Torr
Etching gas: HF 28 sccm+$NH_3$ 19 sccm+Ar 126 sccm
Number of cycles: 1 cycle FIG. 2 is a graph showing the properties of dry etching of a regrowth oxide and a thermal oxide, based on the temperature of a substrate.

Referring to FIG. 2, the substrate's temperature of 80-120° C. indicates a high etching selectivity of a regrowth oxide to a silicon oxide layer as well as a high etch amount, i.e., a high etching speed. Additionally, the substrate's very low temperature of 60° C. indicates a significant decrease in the etching selectivity of the regrowth oxide to the silicon oxide layer, which is caused by a significant increase in the etch amount of the silicon oxide layer. Further, the substrate's very high temperature of 140° C. indicates that the etch amounts themselves of the silicon oxide layer and the regrowth oxide are very low, while indicating that the etching selectivity of the regrowth oxide to the silicon oxide layer is low.

Evaluation of Etching Properties of Regrowth Oxide Based on Processing Pressure

Processing conditions are described as follows.
Processing temperature: 110° C.
Processing pressure: 0.1 Torr, 0.3 Torr, 0.5 Torr, 0.8 Torr, 1 Torr, 1.5 Torr
Etching gas: HF 28 sccm+$NH_3$ 19 sccm+Ar 126 sccm
Number of cycles: 1 cycle FIG. 3 is a graph showing the properties of dry etching of a regrowth oxide and a thermal oxide, based on the pressure of processing.

Figure 3:
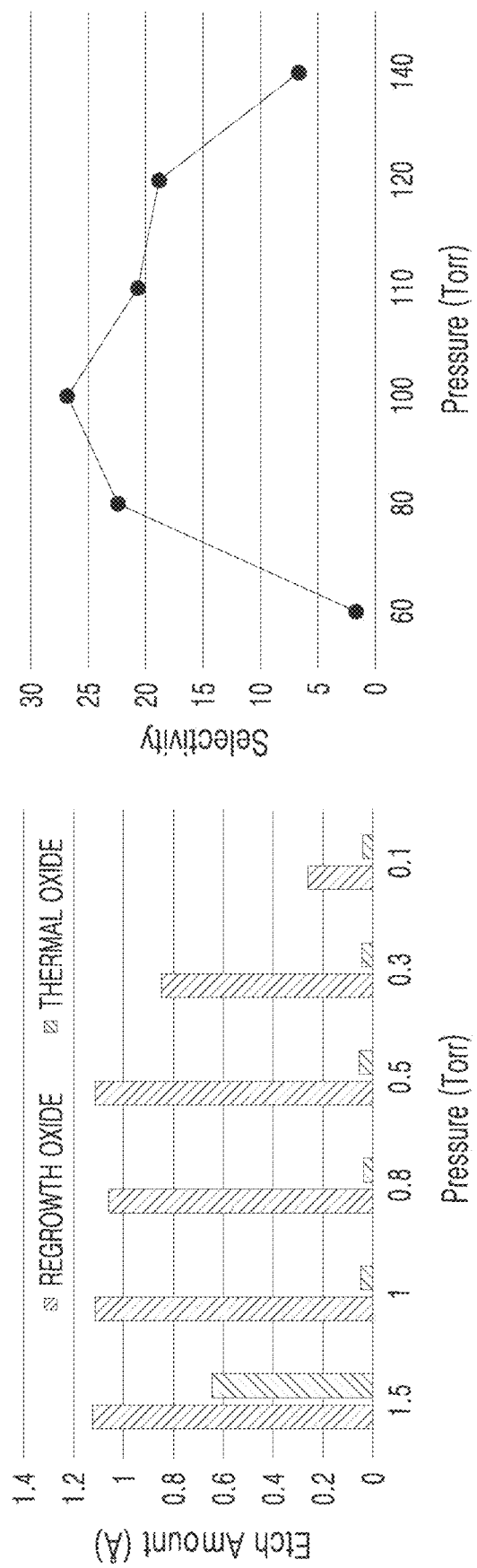
FIG. 3 is a graph showing the properties of dry etching of a regrowth oxide and a thermal oxide, based on the pressure of processing.

Referring to FIG. 3, the processing pressure of 0.3-1.0 Torr indicates a high etching selectivity of a regrowth oxide to a silicon oxide layer as well as a high etch amount. A very high processing pressure of 1.5 Torr indicates a significant decrease in the etching selectivity of the regrowth oxide to the silicon oxide layer, which is caused by a significant increase in the etch amount of the silicon oxide layer. Additionally, a very low processing pressure of 0.1 Torr indicates that the etch amounts themselves of the silicon oxide layer and the regrowth oxide are very low.

Evaluation of Etching Properties of Regrowth Oxide Based on Flow Rate of $NH_3$

Processing conditions are described as follows.
Processing temperature: 110° C.
Processing pressure: 0.8 Torr
Etching gas: HF 28 sccm+Ar 126 sccm+$NH_3$ 0 sccm, 19 sccm, 30 sccm, 40 sccm, 50 sccm, 60 sccm
Number of cycles: 1 cycle FIG. 4 is a graph showing the properties of dry etching of a regrowth oxide and a thermal oxide, based on the flow rate of $NH_3$.

Figure 4:
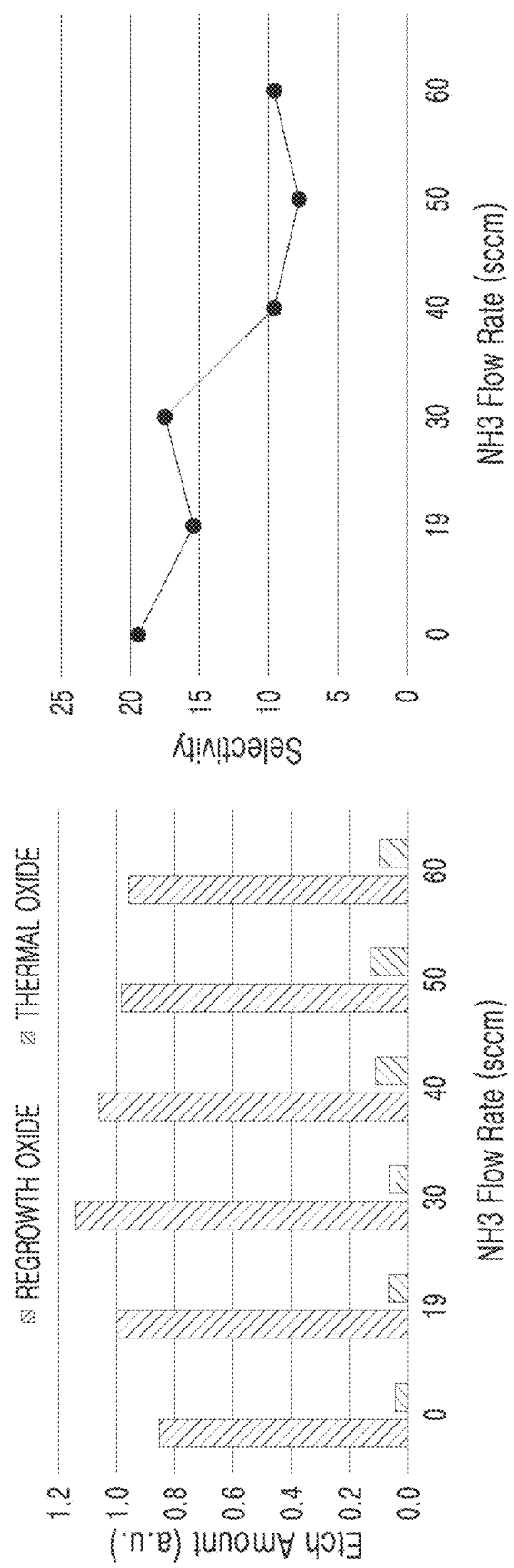
FIG. 4 is a graph showing the properties of dry etching of a regrowth oxide and a thermal oxide, based on the flow rate of $NH_3$.

Referring to FIG. 4, the flow rate of $NH_3$ affects the etching selectivity and the etch amount of the regrowth oxide. Considering this, the flow rate of $NH_3$ is 40 sccm or less, preferably. In particular, a high etching selectivity of the regrowth oxide to the silicon oxide layer is shown at the flow rates of $NH_3$, which are 0 sccm, 19 sccm and 30 sccm.

The etching selectivity increases further at the flow rate of NH$_3$, which is 0 sccm, i.e., in the case where the etching gas is comprised only of HF.

Evaluation of Etching Properties of Regrowth Oxide Based on Flow Rate of HF

Processing conditions are described as follows.

Processing temperature: 110° C.

Processing pressure: 0.8 Torr

Etching gas: HF 28 sccm, 45 sccm, 60 sccm+NH$_3$ 0 sccm+Ar 126 sccm Number of cycles: 1 cycle FIG. 5 is a graph showing the properties of dry etching of a regrowth oxide and a thermal oxide, based on the flow rate of HF.

Figure 5:
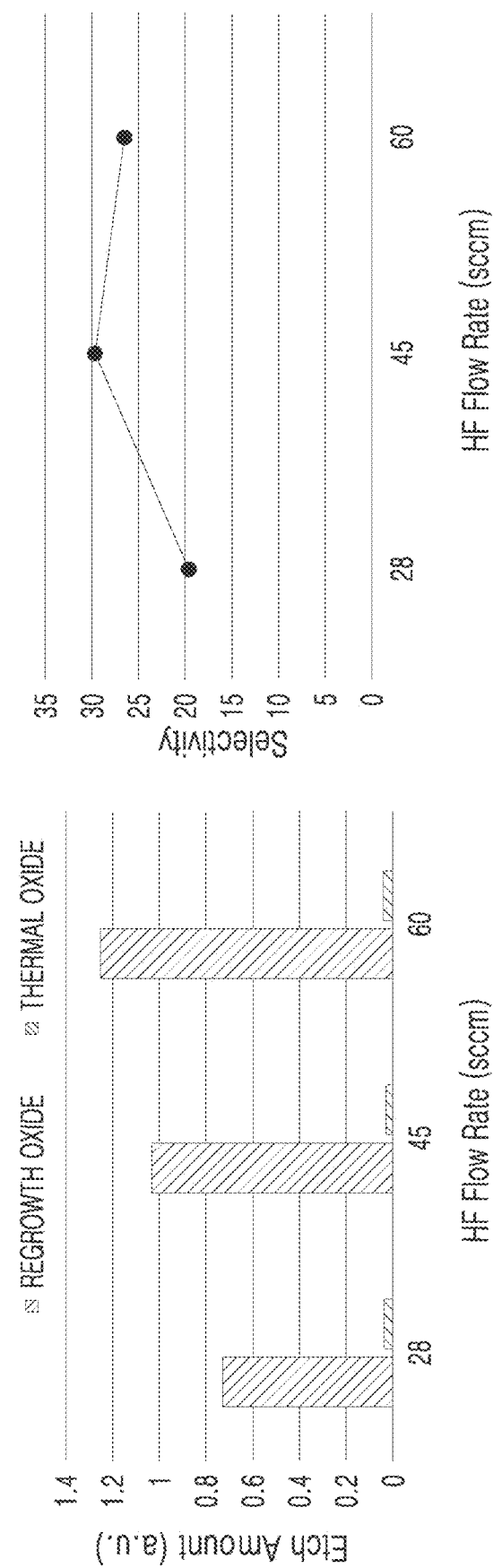
FIG. 5 is a graph showing the properties of dry etching of a regrowth oxide and a thermal oxide, based on the flow rate of HF.

Referring to FIG. 5, in the case where the etching gas comprises HF only, the flow rate of HF affects the etching selectivity and the etch amount of the regrowth oxide to some degree, but a proper etch amount and etching selectivity are shown at all the flow rates of HF that are 28 sccm, 45 sccm and 60 sccm. In this context, the flow rate of HF is 60 sccm or less, preferably. However, in the case where the flow rate of HF is less than 20 sccm, the etch amount of the regrowth oxide may decrease significantly. In the case where the etching gas comprises HF only, the flow rate of HF is preferably 20-60 sccm, and more preferably, 45-60 sccm.

Figure 6:
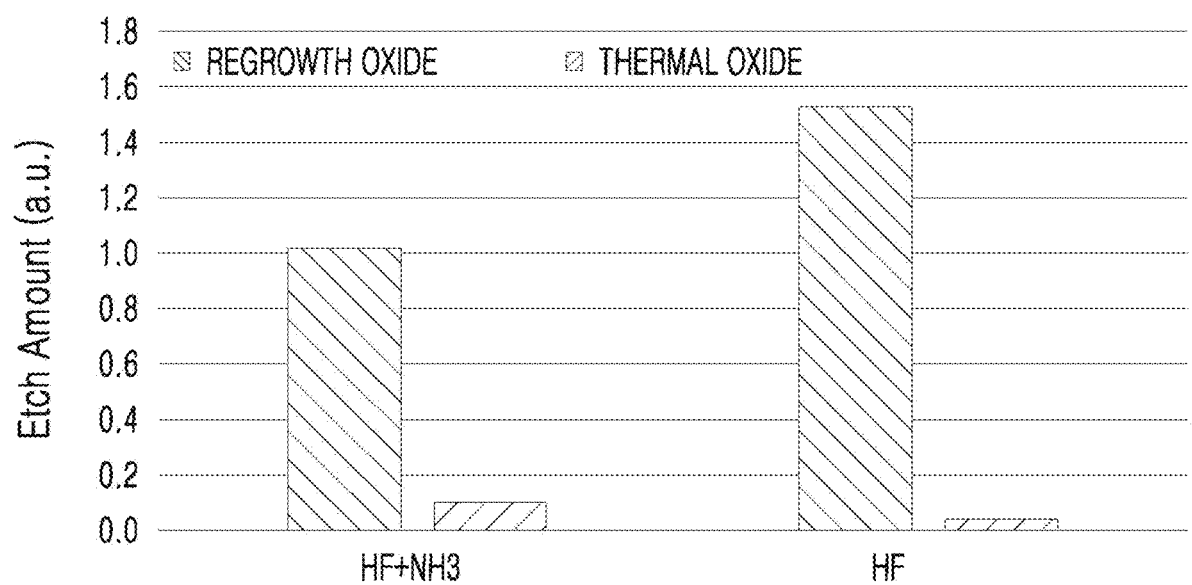
FIG. 6 is a graph showing the properties of dry etching of a regrowth oxide and a thermal oxide, based on the sort of an etching gas.

FIG. 6 is a graph showing the properties of dry etching of a regrowth oxide and a thermal oxide, based on the sort of an etching gas.

On the left of FIG. 6, hydrogen fluoride and ammonia was used as an etching gas, and the etching properties of the regrowth oxide were evaluated at 110° C. and 0.8 Torr, at HF 28 sccm, NH$_3$ 19 sccm and Ar 126 sccm, in one cycle. On the right of FIG. 5, hydrogen fluoride was only used as an etching gas, and the etching properties of the regrowth oxide were evaluated at 110° C. and 1.2 Torr, at HF 56 sccm, NH$_3$ 0 sccm and Ar 126 sccm, in one cycle.

Referring to FIG. 6, an etching gas comprising hydrogen fluoride and ammonia is advantageous over an etching gas comprising hydrogen fluoride only, in terms of the properties of the etching selectivity of the regrowth oxide.

FIGS. 7A to 7E are photos of patterns before and after dry etching of a regrowth oxide.

Figure 7A:
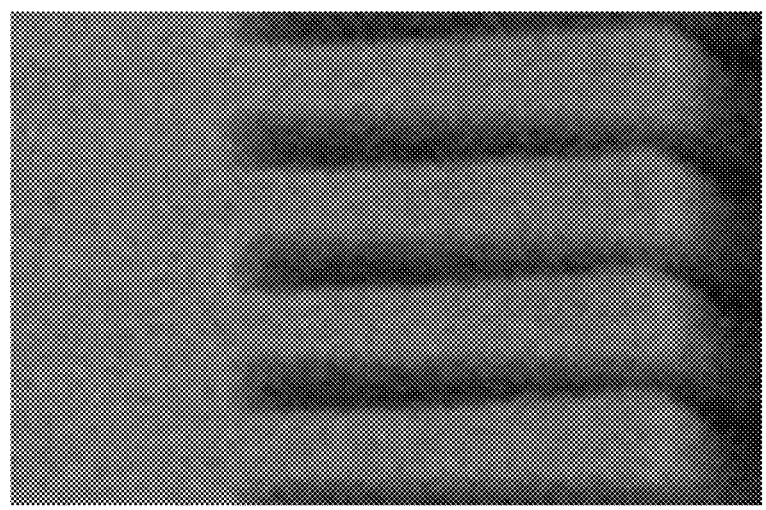
FIGS. 7A to 7E are photos of patterns before and after dry etching of a regrowth oxide.

Specifically, FIG. 7A is a photo of a pattern before dry etching of the regrowth oxide, i.e., a photo of a pattern after etching with a phosphoric acid-based etching solution.

Figure 7B:
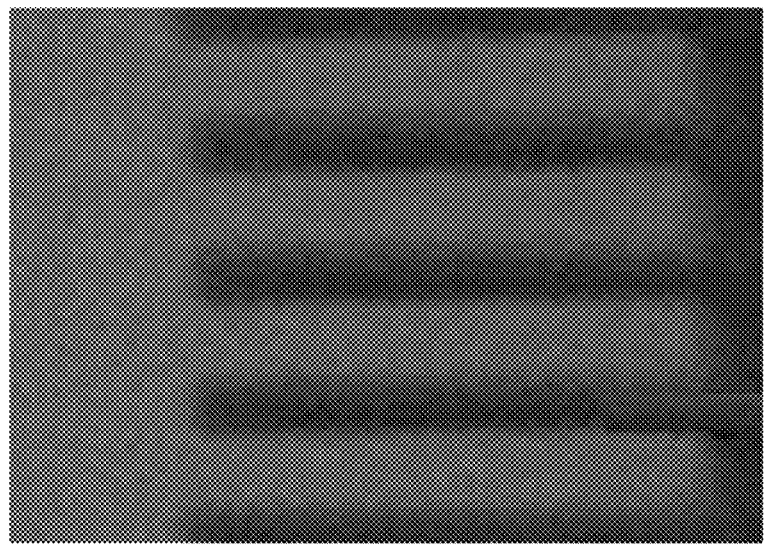

FIG. 7B is a photo of a pattern in the case where the regrowth oxide is etched at 110° C. and 1.2 Torr, at HF 56 sccm, NH$_3$ 0 sccm and Ar 126 sccm, in one cycle.

Figure 7C:
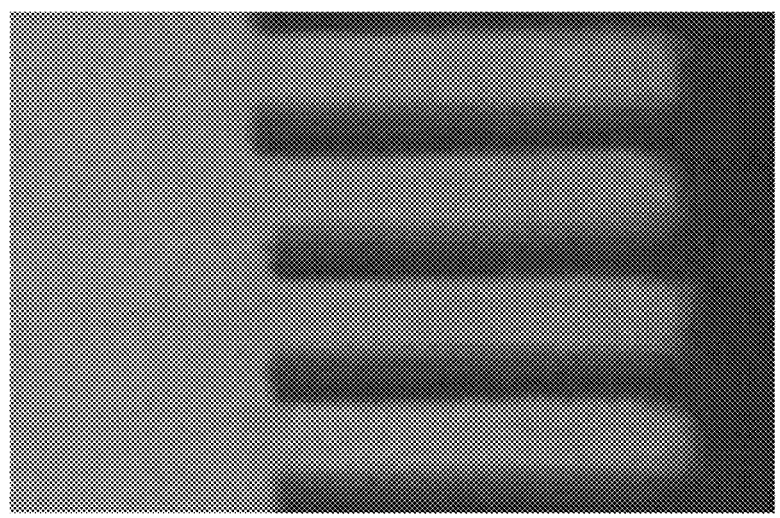

FIG. 7C is a photo of a pattern in the case where the regrowth oxide is etched at 80° C. and 0.8 Torr, at HF 28 sccm, NH$_3$ 0 sccm and Ar 126 sccm, in three cycles.

Figure 7D:
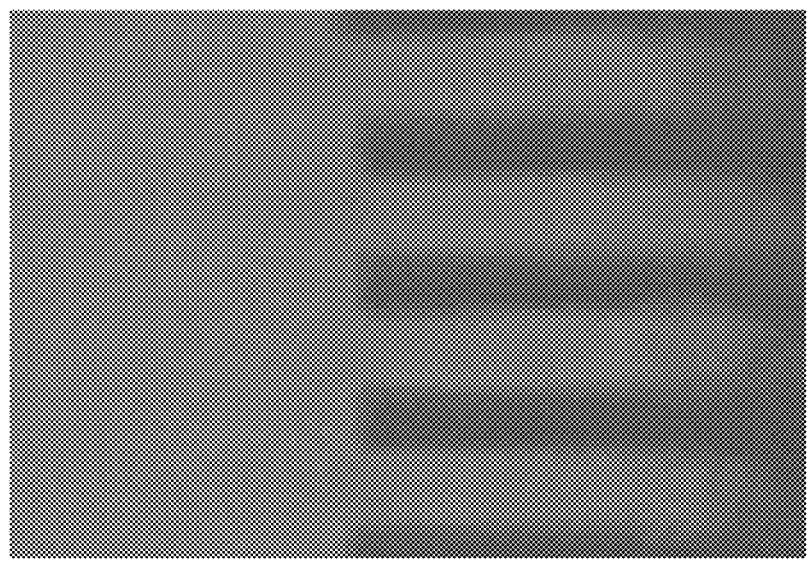

FIG. 7D is a photo of a pattern in the case where the regrowth oxide is etched at 80° C. and 0.8 Torr, at HF 28 sccm, NH$_3$ 0 sccm and Ar 126 sccm, in one cycle.

Figure 7E:
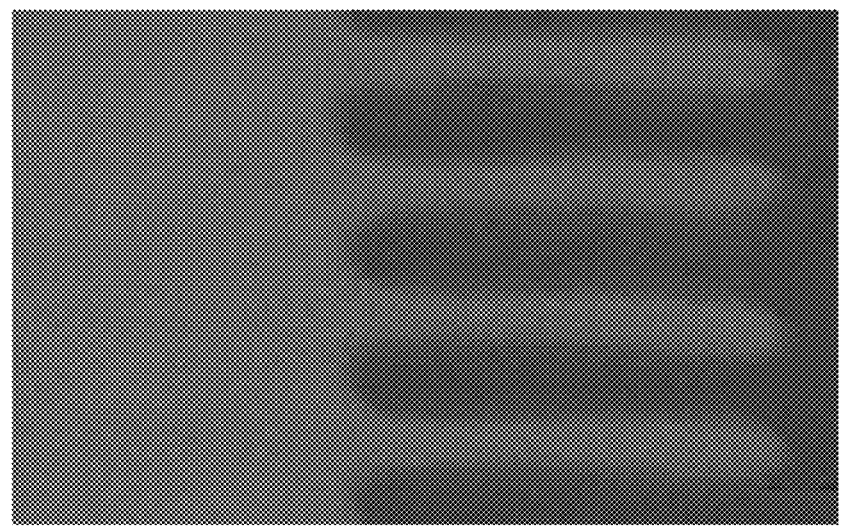

FIG. 7E is a photo of a pattern in the case where the regrowth oxide is etched at 110° C. and 0.8 Torr, at HF 28 sccm, NH$_3$ 19 sccm and Ar 126 sccm, in one cycle.

Referring to FIG. 7A, after wet etching is performed with a phosphoric acid-based etching solution, the thickness of the end side of the pattern of the silicon oxide layer increases. This means that a regrowth oxide is created on the surface of the silicon oxide layer at a time of wet etching.

Referring to FIGS. 7B to 7E, the regrowth oxide is dry-etched with hydrogen fluoride or the regrowth oxide is dry-etched with hydrogen fluoride and ammonia, such that the thickness of the end side of the patter of the silicon oxide layer decreases again. This indicates that the regrowth oxide is removed successfully based on dry etching.

Further, as a result of comparison between FIG. 7C to which the n cycle (three minutes×3 times) is applied and FIG. 7D to which one cycle (three minutes) is applied, FIG. 7C to which the n cycle is applied has an advantage over FIG. 7D to which one cycle (three minutes) is applied when it comes to suppressing damage to the underlying layer.

As described above, in the substrate processing method of the present disclosure, a regrowth oxide, created at a time of wet etching of a silicon nitride layer, may be removed effectively based on dry etching, and an etching selectivity of a regrowth oxide to an oxide that is formed based on deposition and the like under the control of the sort and flow rate of an etching gas, the temperature of a substrate and processing pressure may improve.

The embodiments are described above with reference to a number of illustrative embodiments thereof. However, numerous other modifications and embodiments can be drawn by one skilled in the art within the technical scope of the present disclosure and can be included in the disclosure without departing from the scope of the disclosure Thus, the scope of the right to the subject matter of the disclosure is to be determined according to the appended claims.

The invention claimed is:

1. A substrate processing method, involving etching a silicon nitride layer selectively in a substrate where a silicon oxide layer and the silicon nitride layer are stacked, comprising:
    (a) wet-etching the silicon nitride layer with a phosphoric acid-based etching solution, wherein a regrowth oxide is formed on a surface of the silicon oxide layer; and
    (b) dry-etching the regrowth oxide in the step (a), with an etching gas;
    wherein step (b) is performed when the substrate has a temperature of about 80-120° C. and step (b) is performed at a processing pressure of about 0.3-1.0 Torr.

2. The substrate processing method of claim 1, wherein in step (b), the etching gas comprises hydrogen fluoride and ammonia.

3. The substrate processing method of claim 2, wherein a flow rate of hydrogen fluoride is about 20-60 sccm, and
    a flow rate of ammonia is about 40 sccm or less.

4. The substrate processing method of claim 1, wherein in step (b), the etching gas consists of hydrogen fluoride.

5. The substrate processing method of claim 4, wherein a flow rate of hydrogen fluoride is about 20-60 sccm.

6. The substrate processing method of claim 1, wherein step (b) is performed when the substrate has a temperature of 80-120° C. and step (b) is performed at a processing pressure of 0.3-1.0 Torr.

7. A substrate processing method, involving selectively etching a regrowth oxide that is on a surface of a silicon oxide layer and has density less than that of the silicon oxide layer, comprising:
    dry-etching the regrowth oxide with an etching gas;
    wherein the dry etching is performed when the substrate has a temperature of about 80-120° C. and the dry etching is performed at a processing pressure of about 0.3-1.0 Torr.

8. The substrate processing method of claim 7, wherein the etching gas comprises hydrogen fluoride and ammonia.

9. The substrate processing method of claim 8, wherein a flow rate of hydrogen fluoride is about 20-60 sccm, and
    a flow rate of ammonia is about 40 sccm or less.

10. The substrate processing method of claim 8, wherein the substrate processing method further comprises raising the temperature of a substrate, to remove a reaction byproduct, after the dry etching.

11. The substrate processing method of claim 7, wherein the etching gas consists of hydrogen fluoride.

12. The substrate processing method of claim 11, wherein a flow rate of hydrogen fluoride is about 20-60 sccm.

13. The substrate processing method of claim 11, wherein the substrate processing method further comprises raising the temperature of the substrate, to reduce fluorine content on a surface of the substrate, after the dry etching.

14. The substrate processing method of claim 7, wherein the dry etching is performed when the substrate has a temperature of 80-120° C. and the dry etching is performed at a processing pressure of 0.3-1.0 Torr.

* * * * *